United States Patent
Shindo et al.

(10) Patent No.: US 7,164,097 B2
(45) Date of Patent: Jan. 16, 2007

(54) SOLDER BALL BONDING METHOD AND BONDING DEVICE

(75) Inventors: Osamu Shindo, Tokyo (JP); Toru Mizuno, Tokyo (JP); Youichi Andoh, Tokyo (JP); Satoshi Yamaguchi, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/936,747

(22) Filed: Sep. 9, 2004

(65) Prior Publication Data

US 2005/0051521 A1     Mar. 10, 2005

(30) Foreign Application Priority Data

Sep. 10, 2003 (JP) .............................. 2003-317923

(51) Int. Cl.
   *B23K 1/005*     (2006.01)
(52) U.S. Cl. .............................. 219/121.64; 219/85.12; 219/85.13; 219/121.63
(58) Field of Classification Search .............. 219/85.12, 219/85.13, 85.18, 121.63, 121.64, 121.85; 228/245, 246, 33, 41
   See application file for complete search history.

(56) References Cited

U.S. PATENT DOCUMENTS 3,549,733 A * 12/1970 Caddell .................. 219/121.85
6,059,176 A * 5/2000 Azdasht et al. ............. 228/254
6,336,581 B1 * 1/2002 Tuchiya et al. ................ 228/33
6,543,677 B1 * 4/2003 Pattanaik et al. ........... 228/246
6,742,694 B1 * 6/2004 Satoh et al. ................... 228/41

FOREIGN PATENT DOCUMENTS

| EP | 72609 A1 * | 2/1983 |
| JP | 8-236916 | 9/1996 |
| JP | 11-509375 | 8/1999 |
| JP | 2002-25025 | 1/2002 |

OTHER PUBLICATIONS

Patent Abstracts of WIPO, WO 97/20654, Jun. 12, 1997.

* cited by examiner

*Primary Examiner*—Geoffrey S. Evans
(74) *Attorney, Agent, or Firm*—Oblon, Spivak, McClelland, Maier & Neustadt, P.C.

(57) ABSTRACT

Provided are a solder ball bonding method and a solder ball bonding device for performing bonding of a plurality of electrode portions formed on objects to be bonded by melting solder balls. The solder balls are suctioned by using a plurality of suction nozzles that follow the electrode portions of the objects to be bonded, and conveyed onto the electrode portions. A laser irradiation portion that is positioned above the suction nozzles is then moved in a direction along which the suction nozzles are arranged, while the solder balls are irradiated with laser light passing through suction openings of the suction nozzles by using the laser irradiation portion. Accordingly, it is possible to melt the plurality of solder balls on the electrode portions by using only a single laser irradiation portion.

4 Claims, 6 Drawing Sheets

SOLDER BALL BONDING METHOD AND BONDING DEVICE

BACKGROUND OF THE INVENTION

This application claims priority from Japanese Patent Application No. 2003-317923 filed Sep. 10, 2003, which is hereby incorporated by reference herein.

1. Field of the Invention

The present invention relates to a solder ball bonding method and a solder ball bonding device. In particular, the present invention relates to a solder ball bonding method and a solder ball bonding device that are suited for making fine bonding, such as bonding between a bonding pad that is formed on a magnetic head slider and a pad that is formed on a lead frame side.

2. Related Background Art

A connection method is conventionally known, with which electrodes that are objects to be bonded are placed close to each other, the electrodes are made to contact ball-shaped solder (hereinafter called solder ball), and heat and ultrasonic vibration are applied to the solder ball (so-called ultrasonic pressure welding), thus making an electrical connection between the electrodes.

Further, in addition to bonding by using pressure welding, a bonding method is also known in which a solder ball is disposed between the electrodes, and the solder ball is melted by using laser irradiation, thus making an electrical connection between the electrodes.

Figure 7A:
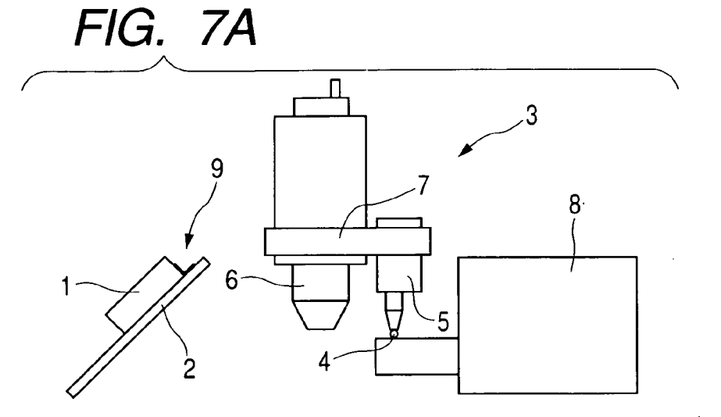
FIGS. 7A, 7B, and 7C are explanatory diagrams that show procedures for bonding between electrodes by melting solder balls using laser irradiation.
Figure 7B:
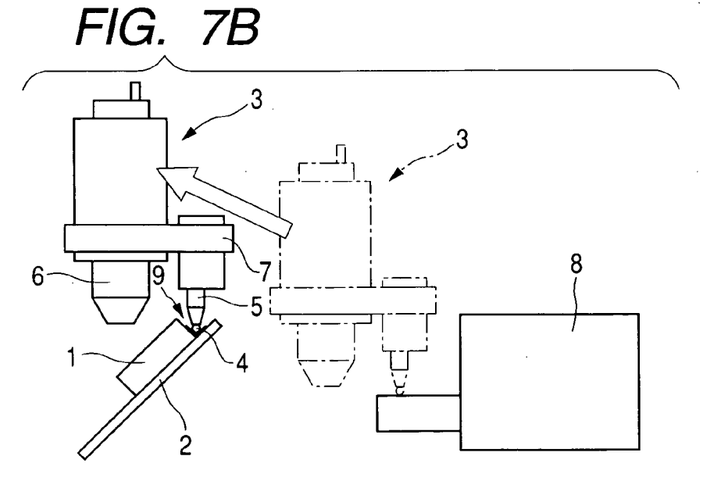
Figure 7C:
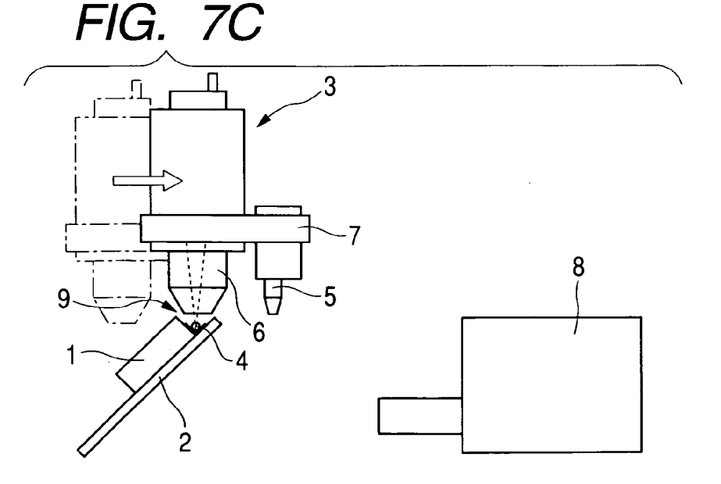

FIGS. 7A, 7B, and 7C are explanatory diagrams that show procedures for performing bonding between electrodes by melting the solder ball using laser irradiation. It should be noted that FIGS. 7A, 7B, and 7C are for bonding a bonding pad that is formed on a magnetic head slider and a pad that is formed on a lead frame side.

Referring to FIG. 7A, for bonding to this type of magnetic head, a slider 1 that configures the magnetic head and is an object to be bonded, and a flexure 2 that supports the slider 1, are both connected in advance by using an adhesive so that the electrodes are in mutual contact.

A bonding device 3 that bonds the slider 1 and the flexure 2 includes a suction nozzle 5 that suctions a solder ball 4, and a laser irradiation portion 6 that irradiates the solder ball 4 with a laser. The suction nozzle 5 and the laser irradiation portion 6 are fixed to a coupling block 7, and are moved reciprocatively between a magnetic head side and a solder ball supplying device 8 side by moving means (not shown).

When bonding the slider 1 and the flexure 2, first the bonding device 3 is moved to the solder ball supplying device 8 side, and the solder ball 4 is suctioned from the solder ball supplying device 8 by using the suction nozzle 5. The moving means is operated after the solder ball 4 is thus suctioned by the suction nozzle 5, conveying the solder ball 4 to an electrode 9 where electrodes of the slider 1 and the flexure 2 contact, as shown in FIG. 7B. Suctioning by the suction nozzle 5 is then stopped, and the solder ball 4 is then loaded onto the electrode 9. The moving means is once again operated after the solder ball 4 is loaded onto the electrode 9, moving the laser irradiation portion 6 to a position above the solder ball 4. The laser is then used to irradiate the solder ball 4 to melt the solder ball 4 and perform connection between the electrodes that are formed on the slider 1 and the flexure 2 (refer to JP 2002-25025 A, FIG. 6, for example).

Further, a bonding device having a laser light source disposed above the device, and having a connection element that is provided with a connection piece that supplies a solder ball on a side portion of the bonding device, is known as another solder ball bonding device. After being dropped into the connection element, the solder ball is melted by using the laser light source (refer to JP 11-509375 A, FIG. 1, for example).

In addition, a device having a three layer structure made from an arrangement mask, a shutter mask, and a supply mask is also known as another type of solder ball bonding device. By sliding the shutter mask that is sandwiched between the arrangement mask and the supply mask, a solder ball freely falls from the arrangement mask side to the supply mask side, thus supplying the solder ball onto a pad to make bonding (refer to JP 8-236916 A, FIG. 8, for example).

However, problems such as those described below exist with the solder ball bonding devices mentioned above.

More particularly, with methods of bonding objects by combining heating and ultrasonic vibration, an external force sufficient to perform pressure welding must be applied to the objects. For example, for a case where the bonding objects are a slider and a flexure that constitute a magnetic head, a receiving member that receives an external force must be provided to a back surface side in order to prevent deformation due to the external force. There is a problem as a result in that the number of device configuring members increases.

Further, with another bonding device in which the suction nozzle 5 and the laser irradiation portion 6 are provided, after the solder ball 4 is loaded onto the electrode 9 by using the suction nozzle 5, the solder ball 4 cannot be held at a bonding device side. Therefore, there is a danger that the solder ball 4 becomes loaded onto the electrode 9 will shift position due to an external disturbance. Accordingly, there is a problem in that additional means for holding the solder ball 4 has to be provided in addition to a manufactured product itself and the bonding device.

Furthermore, the bonding devices described above, that is the bonding devices that use pressure welding, the bonding devices that use the suction nozzle 5 and the laser irradiation portion 6, and the bonding devices that use the connection element having the laser light source and the bonding piece, perform bonding to a single electrode. For cases in which a plurality of electrodes exist, the series of processes described above must be repeated for each of the plurality of electrodes, and it is difficult to increase the efficiency of the manufacturing processes.

In addition, although it is possible to arrange a plurality of solder balls in a plurality of holes with the devices having the three-layer structure made from the arrangement mask, the shutter mask, and the supply mask, bonding cannot be performed by conveying isolated specific solder balls to specific locations.

SUMMARY OF THE INVENTION

In consideration of the conventional problems described above, an object of the present invention is to provide a solder ball bonding method and a solder ball bonding device that can prevent solder balls from moving on a bonding portion, and can increase the efficiency of bonding processing, without applying an external force to a bonding object.

The present invention is based on findings that bonding time can be shortened, and that a solder ball can reliably be held on an electrode, provided that a single laser irradiation portion is installed such that it can move between a plurality of laser ball suction portions, and that a restricting surface that prevents the solder ball from rolling is provided at a distal end of the solder ball suction portion.

According to one aspect of the invention, there is provided a solder ball bonding method for performing bonding of a plurality of electrode portions formed on objects to be bonded by melting solder balls, the solder ball bonding method including:

suctioning the solder balls by using a plurality of suction nozzles that follow the electrode portions of the objects to be bonded;

conveying the solder balls onto the electrode portions;

moving a laser irradiation portion that is positioned above the suction nozzles in a direction along which the suction nozzles are arranged; and irradiating the solder balls with laser light passing through suction openings of the suction nozzles by using the laser irradiation portion to melt the plurality of solder balls on the electrode portions.

According to another aspect of the invention, there is provided a solder ball bonding method for performing bonding of a plurality of electrode portions, the electrode portions formed having V-shaped cross sections by abutting of objects to be bonded, by melting a plurality of solder balls, the solder ball bonding method including:

suctioning the solder balls by using a plurality of suction nozzles that follow the electrode portions of the objects to be bonded;

conveying the solder balls so that the solder balls contact the V-shaped grooves of the electrode portions;

restricting rolling of the solder balls in a direction that is orthogonal to a ridge line direction of the V-shaped grooves of the electrode portions by using the suction nozzles;

moving a laser irradiation portion that is positioned above the suction nozzles in a direction along which the suction nozzles are arranged; and irradiating the solder balls with laser light passing through suction openings of the suction nozzles by using the laser irradiation portion, to melt the plurality of solder balls on the electrode portions.

In further aspect of the solder ball bonding method, an inert gas may be supplied from the suction openings of the suction nozzles when irradiating the solder balls with the laser.

According to another aspect of the invention, there is provided a solder ball bonding device for performing bonding of a plurality of electrode portions formed on objects to be bonded by conveying solder balls to the plurality of electrode portions and melting the conveyed solder balls by laser irradiation, the solder ball bonding device including:

a device main body;

a conjugate space that is formed within the device main body;

a plurality of suction nozzles disposed corresponding to the plurality of electrode portions, the suction nozzles having suction openings and the suction nozzles communicating with the conjugate space;

a supplying and exhausting means that is connected to the device main body and that changes the pressure in the conjugate space;

a laser irradiation portion that irradiates with laser light passing through the suction openings of the suction nozzles to a side that is opposite the suction nozzles sandwiching the device main body; and conveying means that is disposed between the laser irradiation portion and the device main body, the conveying means being capable of moving the laser irradiation portion in a direction along which the plurality of electrode portions are disposed, wherein, in the solder boll bonding device, the solder balls are suctioned by the plurality of suction nozzles, and melted in succession by movement of the laser irradiation portion.

According to another aspect of the invention, there is provided a solder ball bonding device for performing bonding of a plurality of electrode portions, the electrode portions formed having V-shaped cross sections by abutting of objects to be bonded, by conveying solder balls to the plurality of electrode portions and melting the conveyed solder balls by laser irradiation, the solder ball bonding device including:

a device main body;

a conjugate space that is formed within the device main body;

a plurality of suction nozzles disposed corresponding to the plurality of electrode portions, the suction nozzles having suction openings and the suction nozzles communicating with the conjugate space;

restricting surfaces in the suction nozzles that restrict rolling motion of the solder balls in a direction that is orthogonal to a ridge line of the V-shaped grooves of the electrode portions;

supplying and exhausting means that is connected to the device main body and that changes the pressure in the conjugate space;

a laser irradiation portion that irradiates with laser light passing through the suction openings of the suction nozzles to a side that is opposite the suction nozzles sandwiching the device main body; and conveying means that is disposed between the laser irradiation portion and the device main body, the conveying means being capable of moving the laser irradiation portion in a direction along which the plurality of electrode portions are disposed, and in the solder boll bonding device, the solder balls are suctioned by the plurality of suction nozzles, and melted in succession by movement of the laser irradiation portion.

In a further aspect of the solder ball bonding device, inert gas supplying means may be connected to the device main body, the inert gas supplying means communicating with the conjugate space.

According to the configuration described above, solder balls can be suctioned by a suction action of a suction nozzle provided that air supplying and exhausting means is operated, making a conjugate space into a low pressure environment. After suctioning the solder ball by using the suction nozzle, the solder ball bonding device itself is moved, aligning a plurality of the suction nozzles with the locations of a plurality of electrode portions. Pressure is then introduced into the conjugate space by using the air supplying and exhausting means, returning the conjugate space from the low pressure environment to atmospheric pressure (that is, vacuum break). The suction forces due to the suction nozzles are thus released, and the solder balls are thus placed in a state separable from the suction nozzles.

After placing the solder balls in a state separable from the suction nozzles, laser irradiation of the solder balls is performed by using a laser irradiation portion, causing the solder balls to melt and performing electrical bonding of electrode portions of objects to be bonded. It should be noted that inert gas may be introduced into the conjugate space by using inert gas supplying and exhausting means, and that the inert gas may be sprayed toward the solder balls by the suction nozzles in order to prevent oxidation of the solder balls when performing laser irradiation.

After one of the solder balls that are loaded onto the plurality of electrode portions is thus melted to effect bonding between electrode portions, a conveying means is operated and the laser irradiation portion is moved to a position where laser irradiation from the laser irradiation portion passes through a suction opening of the adjacent suction nozzle. After thus moving the laser irradiation portion, laser irradiation to the solder balls may be performed again, thus bonding the adjacent electrode portions.

It becomes possible to melt a plurality of solder balls by using a single laser irradiation portion by using this type of configuration, and therefore, a short bonding time can be achieved.

In addition, if the restricting surface is formed at the distal end of the suction nozzle, rolling restrictions can be placed on the solder balls at a V-shaped groove formed by the restricting surface and the electrode portions. The solder balls can therefore be prevented from separating from the electrode portions, even if the low pressure environment of the conjugate space is released and the solder balls separate from the suction nozzles. Accordingly, the solder balls can be reliably melted, and the reliability of bonding the electrode portions can be increased.

As explained above, according to the present invention, there is provided a solder ball bonding method for performing bonding of a plurality of electrode portions formed on bonding objects by melting solder balls. After suctioning the solder balls by using a plurality of suction nozzles that follow the electrode portions of the bonding objects, and conveying the solder balls onto the electrode portions, a laser irradiation portion positioned above the suction nozzles is moved in the direction in which the suction nozzles are arranged. The laser irradiation portion is used to irradiate the solder balls with laser light passing through suction openings of the suction nozzles, thus melting the plurality of solder balls on the electrode portions. Accordingly, it becomes possible to prevent movement of the solder balls on the bonding portions without applying an external force to the bonding objects, and it becomes possible to increase the efficiency of the bonding process.

DESCRIPTION OF THE PREFERRED EMBODIMENTS

Figure 1:
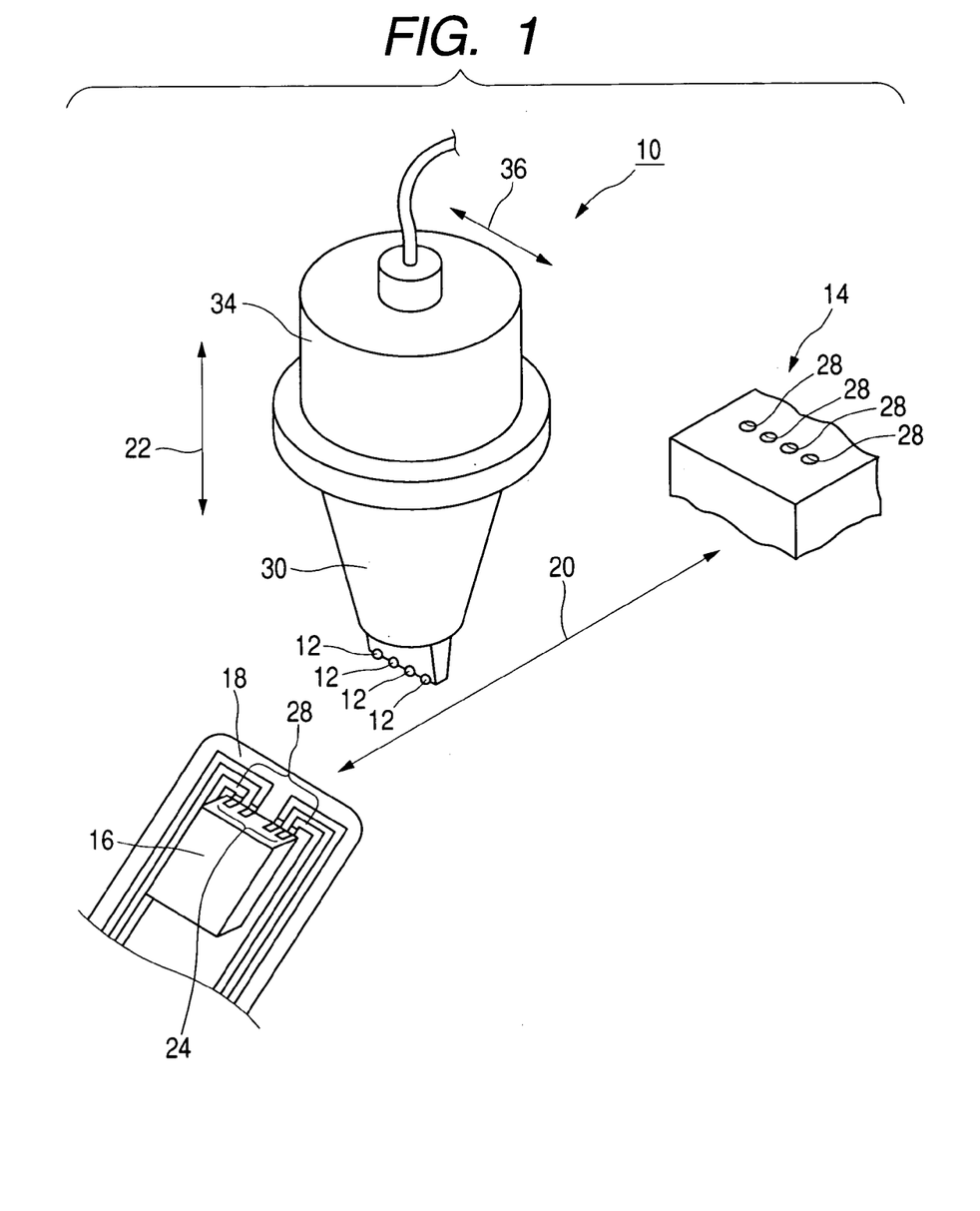
FIG. 1 is a perspective view that shows an entire solder ball bonding device according to an embodiment of the present invention.

Specific preferred embodiments of a solder ball bonding method and a solder ball bonding device relating to the present invention are described below with reference to the drawings. FIG. 1 is a perspective view that shows an entire solder ball bonding device according to this embodiment. Referring to FIG. 1, a solder ball bonding device 10 according to this embodiment is made possible to move reciprocatively between a supplying device 14 that supplies solder balls 12 and structural parts of a magnetic head to be bonded (that is, a slider 16 in which GMR elements or the like are embedded, and a flexure 18 that supports the slider 16) by a moving means (not shown). It should be noted that the moving means can move in the directions of an arrow 20 and an arrow 22 in FIG. 1. Motion between the supplying device 14 and the structural parts of the magnetic head is achieved by combining the directions shown by the arrow 20 and the arrow 22. Further, image recognizing means that operates in response to the moving means makes determinations regarding suction of the solder balls 12 by suction nozzles described later, and positioning of the solder balls 12 with respect to electrodes on the magnetic head side. The moving means performs accurate positioning with respect to object positions based on information from the image recognizing means.

There are four electrodes 24 in total formed on the slider 16 in this embodiment. Electrodes 26 that correspond to the electrodes 24 are formed on the flexure 18. The electrodes 24 and the electrodes 26 are disposed mutually orthogonal to each other such that edges thereof are close to each other (that is, the electrodes 24 and the electrodes 26 form V-shaped grooves).

Further, solder ball supply holes 28 are formed in the supplying device 14 for the solder balls 12, corresponding to the electrodes that are formed in the slider 16 and the flexure 18. The solder ball supply holes 28 are formed parallel to the direction at which the electrodes are disposed, and at a pitch that is equal to the electrode pitch. The solder ball supply holes 28 make it possible to supply a plurality of the solder balls 12 at the same time.

The solder ball bonding device 10 that moves reciprocatively between the supplying device 14 and the magnetic head side has a main structure that includes a cone shape member 30 that is a device main body, a plurality of suction nozzles 32 that are formed at the bottom of the cone shape member 30 (refer to FIGS. 2A and 2B), and a laser irradiation portion 34 that is disposed on an opposite side of the suction nozzles 32 through the cone shape member 30. It should be noted that conveying means (not shown) is provided between the cone shape member 30 and the laser irradiation portions 34. It is possible to move the laser irradiation portion 34 in the direction of an arrow 48, that is, in the direction in which the electrodes are disposed, by operating the conveying means.

Figure 2A:
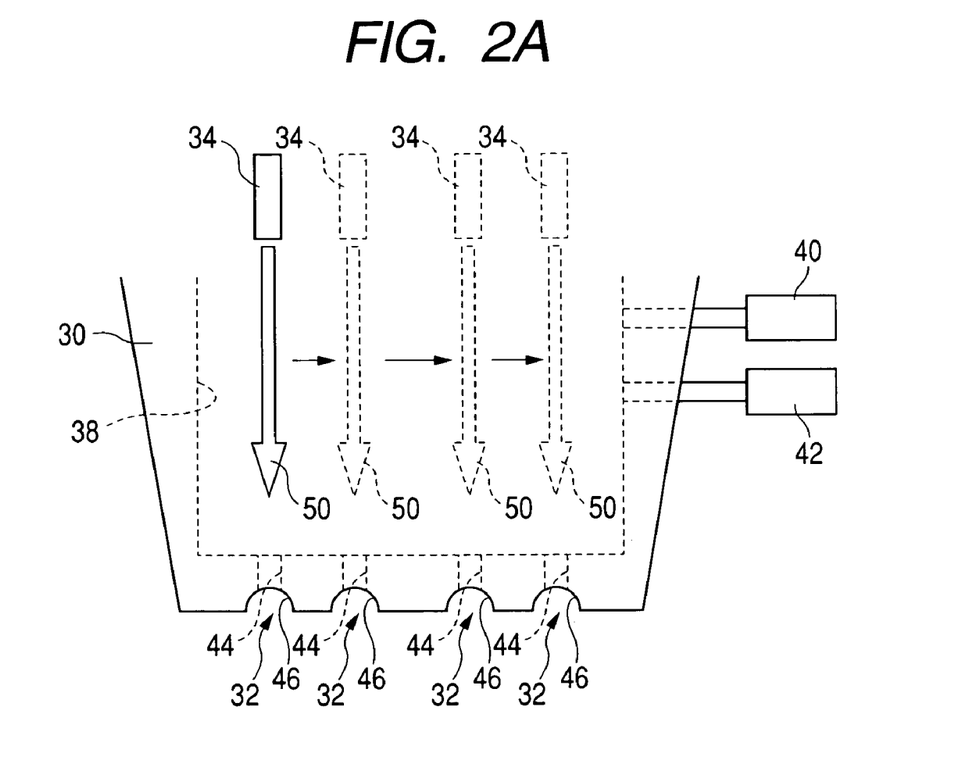
FIGS. 2A and 2B are explanatory diagrams that show the structure of a solder ball bonding device, FIG. 2A showing a front view and FIG. 2B showing a lower side view.
Figure 2B:
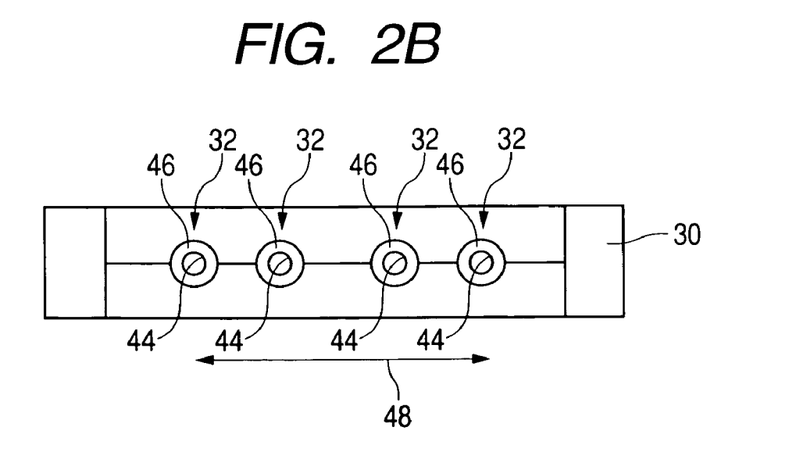

FIGS. 2A and 2B are explanatory diagrams that show the structure of a solder ball bonding device. FIG. 2A is a front view, and FIG. 2A is a lower side view.

Referring to FIGS. 2A and 2B, the cone shape member 30 is provided in a center portion with the solder ball bonding device 10. A conjugate space 38 is formed in an inner portion of the cone shape member 30, and supplying and exhausting means 40 and nitrogen gas supplying means 42 serving as inert gas supplying means are connected to the conjugate space 38. It is possible to reduce the pressure within the conjugate space 38 and perform suction from the suction nozzles 32, and it is possible to release the conjugate space 38 that is under a low pressure environment to the atmospheric atmosphere (that is, vacuum break). It is also possible to supply nitrogen gas within the conjugate space 38, and inject nitrogen gas from the suction nozzles 32.

Figure 3:
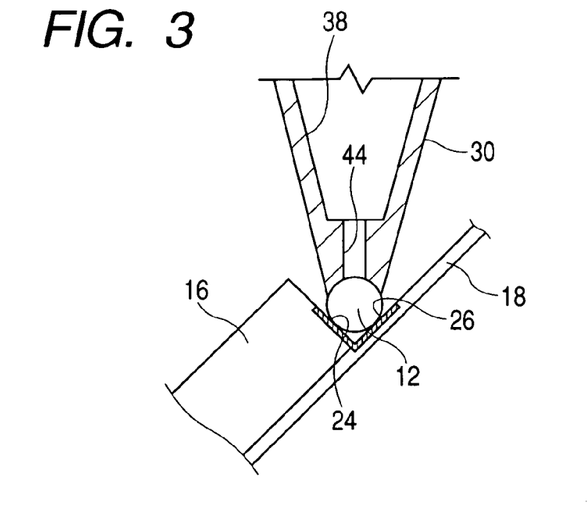
FIG. 3 is an explanatory diagram that shows a state where a solder ball is restricted by a restricting surface and an electrode.

Further, the plurality of suction nozzles 32 that are provided at the bottom of the cone shape member 30 each have a suction opening 44 in a center portion thereof, the suction openings communicating with the conjugate space 38. Restricting surfaces 46 that restrict rolling of the solder balls 12 are provided in the periphery of the suction openings 44. Here, the restricting surfaces 46 restrict rolling of the solder balls 12 in the direction of an arrow 48 shown in FIG. 2B. For example, if the direction of the arrow 48 coincides with a ridge line direction of the V-shaped grooves formed by the electrodes 24 and the electrodes 26, as shown in FIG. 3, the electrodes 24 and the electrodes 26 restrict the movement of the solder balls 12 in a direction that is normal with respect to the arrow 48, and therefore the solder balls 12 are restricted by the restricting surfaces 46 and the electrodes 24 and 26, fixed in positions on the electrodes 24 and 26. Accordingly, the solder balls 12 can be maintained in their positions without separating from the electrodes, even when the suction of the suction nozzles 32 is stopped after the solder balls 12 are conveyed onto the electrodes by the suction nozzles 32, and the solder balls 12 can separate from the suction nozzles 32.

The laser irradiation portion 34 that is provided above the cone shape member 30 is connected through the conveying means to the cone shape member 30. The laser irradiation portion 34 can irradiate laser light 50, passing through the suction openings 44 in the suction nozzles 32. Accordingly, it becomes possible to irradiate consecutively the laser light 50 to adjacent suction openings 44 as shown in FIG. 2A, provided that the conveying means is operated and the relative position of the laser irradiation portion 34 with respect to the cone shape member 30 is varied.

It should be noted that, although the conveying means that physically moves the laser irradiation portion 34 is used in this embodiment, the present invention is not limited to this configuration. It is also possible to irradiate the laser light 50 passing through each of the suction openings 44 by using an optical means. That is, the laser light 50 can be made to pass through each of the suction openings 44, without moving the laser irradiation portion 34, if a polygonal mirror or a scanning mirror is disposed directly behind the laser irradiation portion 34, and an f-θ lens is disposed downstream of the polygonal mirror or the scanning mirror.

Further, suitable conveying means may be selected according to manufactured product specifications, such as a precision feeding mechanism that uses a servomotor or a stepping motor, provided that the conveying means is mechanically structured.

Procedures for bonding the electrodes 24 that are formed on the magnetic head slider 16 and the electrodes 26 that are formed on the flexure 18 side by using the solder ball bonding device 10 configured as described above is explained.

It should be noted that the solder balls 12 that are used for bonding the electrodes 24 and the electrodes 26 have an outer diameter on the order of 80 to 150 microns.

Figure 4:
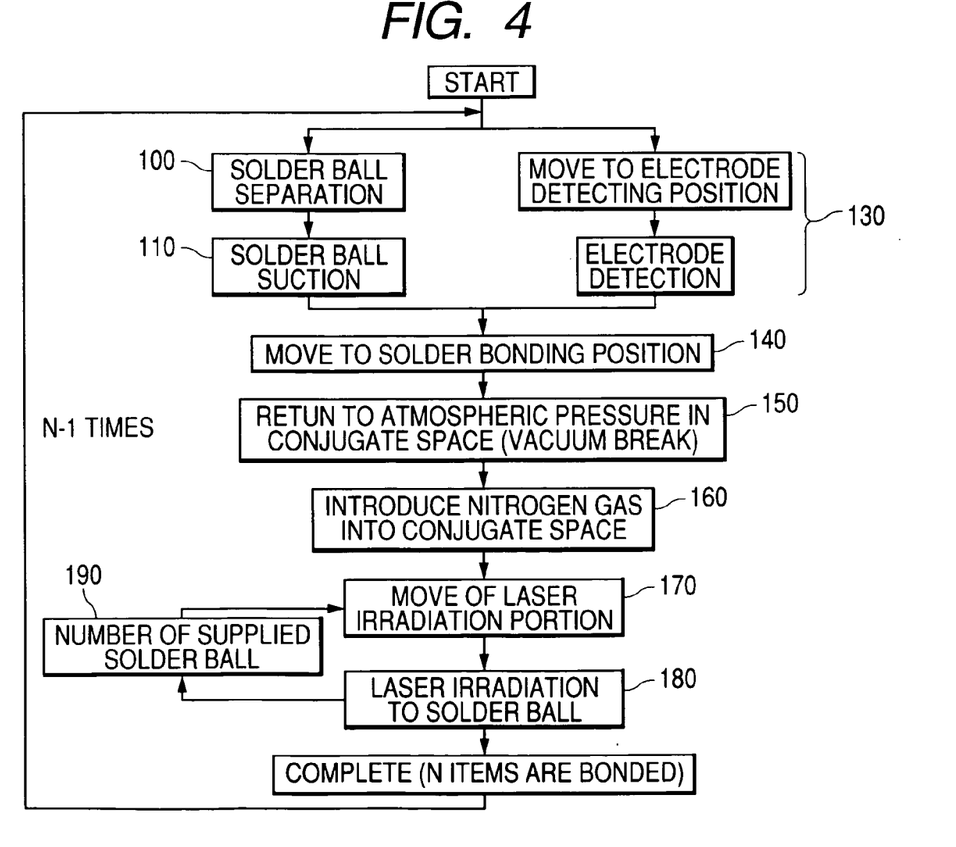
FIG. 4 is a flowchart that shows operation procedures of the solder ball bonding device.
Figure 5A:
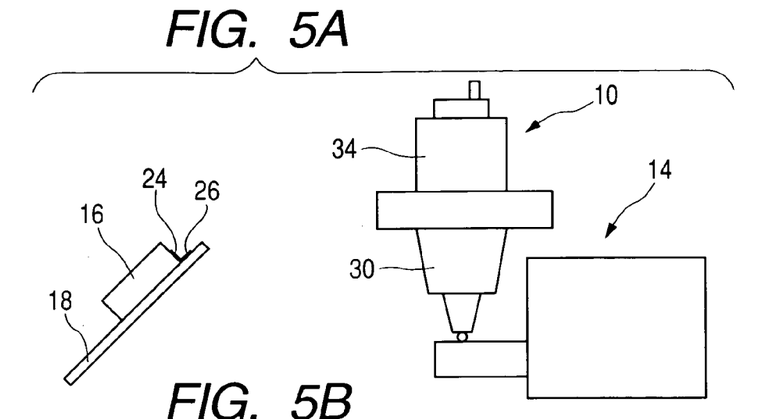
FIGS. 5A, 5B, and 5C are explanatory diagrams that show operation procedures of the solder ball bonding device.
Figure 5B:
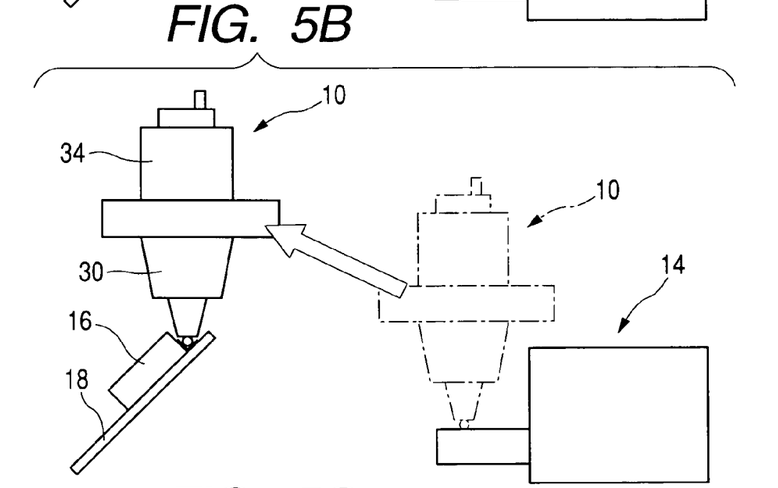
Figure 5C:
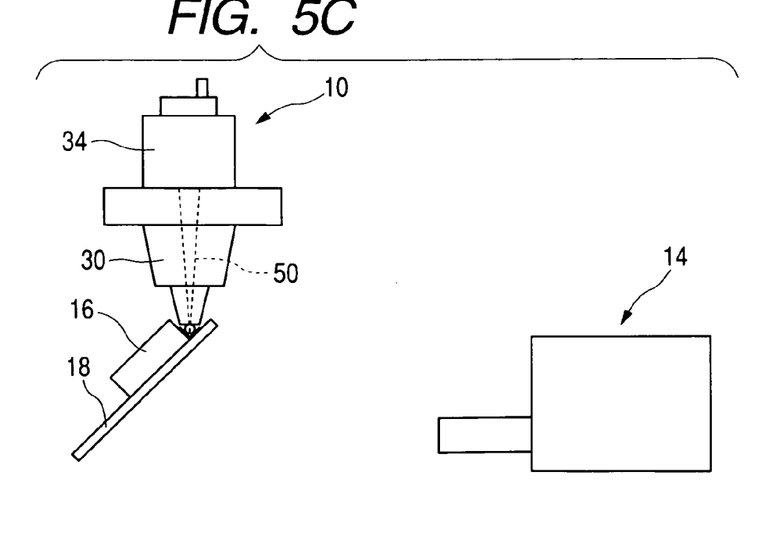

FIG. 4 is a flowchart that shows operational procedures of the solder ball bonding device. FIGS. 5A, 5B, and 5C are explanatory diagrams that show operation procedures of the solder ball bonding device.

Referring to FIG. 5A, first the solder ball bonding device 10 is moved to the solder ball supplying device 14 side with this type of magnetic head bonding. Then, the suction nozzles 32 suction the solder balls 12 that are positioned in the solder ball supply holes 28 of the solder ball supplying device 14, moving the solder balls 12 to the suction nozzles 32 side. It should be noted that, during these operations, suction to the solder ball supplying holes 28 is stopped (step S100), and the supplying and exhausting means 40 is operated to place the inside of the conjugate space 38 in a low pressure environment (step S110).

It should also be noted that, together with the operations of steps S100 and S110, detection of the positions of the electrodes 24 and 26, which are bonding objects, is performed by the image recognizing means.(step S130).

After the processes of steps S100, S110, and S130 are complete, the moving means is operated to move the solder ball bonding device 10 to a solder bonding position as shown in FIG. 5B (step S140).

After the solder ball bonding device 10 is moved to the solder bonding position, the supplying and exhausting means 40 is operated, returning the inside of the conjugate space 38 to atmospheric pressure (vacuum break) (step S150). Nitrogen gas is then introduced into the conjugate space 38 by the nitrogen gas supplying means 42, and the nitrogen gas is expelled from the suction nozzles 32 (step S160).

Figure 6:
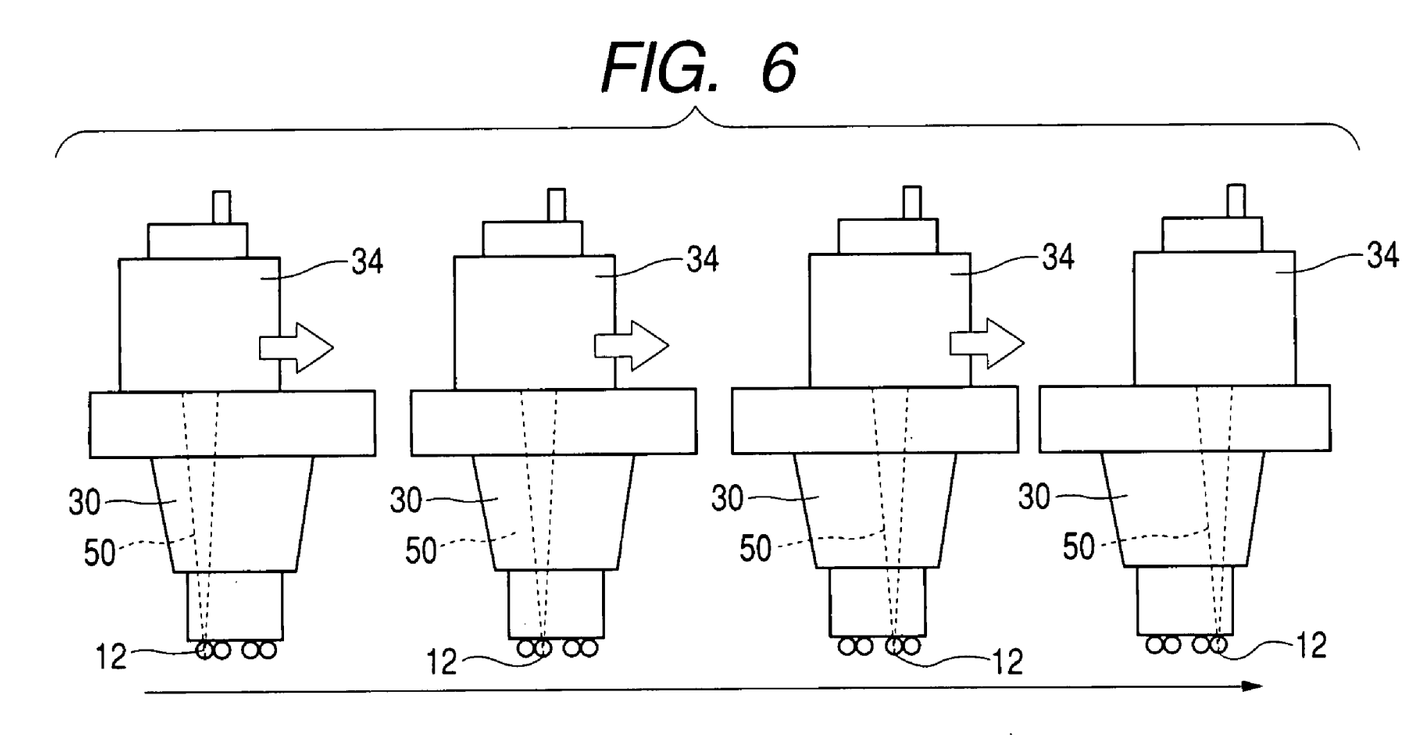
FIG. 6 is an operational explanatory diagram that shows solder ball melting procedures.

The laser irradiation portion 34 is then operated while maintaining the state in step S160 where the nitrogen gas is being expelled. The laser irradiation portion 34 is moved to an initial position (step S170), and the laser light 50 is then irradiated to an arbitrary solder ball 12 (step S180). Referring to FIG. 6, steps S170 and S180 are then repeatedly performed for each of the solder balls 12, as shown in FIG. 6 (step S190).

If a plurality of solder balls are disposed at the same time on objects to be bonded, and the solder balls are melted by a single laser irradiation portion while maintaining the disposed state, a large decrease in the amount of bonding time can be achieved compared with a bonding process performed conventionally in which one solder ball is melted in one process. That is, according to an investigation by the applicants of the present invention, the working efficiency can be increased by 70% compared to a conventional solder ball bonding device when the solder ball bonding device according to this embodiment is used.

What is claimed is:

1. A solder ball bonding method for performing bonding of a plurality of electrode portions, the electrode portions formed having V-shaped cross sections by abutting of objects to be bonded, by melting a plurality of solder balls, the solder ball bonding method comprising:

suctioning the solder balls by using a plurality of suction nozzles that follow the electrode portions of the objects to be bonded;

conveying the solder balls so that the solder balls contact the V-shaped grooves of the electrode portions;

restricting rolling of the solder balls in a ridge line direction of the V-shaped grooves of the electrode portions by using the suction nozzles;

moving a laser irradiation portion that is positioned above the suction nozzles in a direction along which the suction nozzles are arranged; and irradiating the solder balls with laser light passing through suction openings of the suction nozzles by using the laser irradiation portion, to melt the plurality of solder balls on the electrode portions.

2. A solder ball bonding method according to claim 1, which comprises supplying an inert gas from the suction openings of the suction nozzles when irradiating the solder balls with the laser.

3. A solder ball bonding device for performing bonding of a plurality of electrode portions, the electrode portions formed having V-shaped cross sections by abutting of objects to be bonded, by conveying solder balls to the plurality of electrode portions and melting the conveyed solder balls by laser irradiation, the solder ball bonding device comprising:
- a device main body;
- a conjugate space that is formed within the device main body;
- a plurality of suction nozzles disposed corresponding to the plurality of electrode portions, the suction nozzles having suction openings and the suction nozzles communicating with the conjugate space;
- restricting surfaces in the suction nozzles that restrict rolling motion of the solder balls in a ridge line direction of the V-shaped grooves of the electrode portions;
- supplying and exhausting means that is connected to the device main body and that changes the pressure in the conjugate space;
- a laser irradiation portion that irradiates with laser light passing through the suction openings of the suction nozzles to a side that is opposite the suction nozzles sandwiching the device main body; and
- conveying means that is disposed between the laser irradiation portion and the device main body, the conveying means being capable of moving the laser irradiation portion in a direction along which the plurality of electrode portions are disposed, wherein the solder balls are suctioned by the plurality of suction nozzles, and are melted in succession by movement of the laser irradiation portion.

4. A solder ball bonding device according to claim 3, further comprising an inert gas supplying means connected to the device main body, the inert gas supplying means communicating with the conjugate space.

* * * * *